US010181859B2

(12) United States Patent
Barrenscheen et al.

(10) Patent No.: US 10,181,859 B2
(45) Date of Patent: Jan. 15, 2019

(54) DEVICE AND METHOD FOR REQUESTING AN ANALOG-TO-DIGITAL CONVERSION

(71) Applicant: Infineon Technologies AG, Neubiberg (DE)

(72) Inventors: Jens Barrenscheen, Munich (DE); Peter Bogner, Wernberg (AT); Juergen Schaefer, Oberhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/895,453

(22) Filed: Feb. 13, 2018

(65) Prior Publication Data

US 2018/0234103 A1    Aug. 16, 2018

(30) Foreign Application Priority Data

Feb. 14, 2017   (DE) .......................... 10 2017 001 422

(51) Int. Cl.
*H03M 1/00* (2006.01)
*H03M 1/12* (2006.01)
*H02P 27/06* (2006.01)
*H02M 3/335* (2006.01)

(52) U.S. Cl.
CPC ......... *H03M 1/1245* (2013.01); *H03M 1/122* (2013.01); *H02M 3/33546* (2013.01); *H02P 27/06* (2013.01)

(58) Field of Classification Search
CPC ..... H03M 1/1245; H03M 1/122; H02P 27/06; H02M 3/33546

USPC .................................................. 341/122, 155
See application file for complete search history.

(56) References Cited

U.S. PATENT DOCUMENTS

| | | | | |
|---|---|---|---|---|
| 7,126,515 B1 * | 10/2006 | Kris | .................... | H03M 1/1215 341/141 |
| 8,022,853 B2 * | 9/2011 | Guido | ................. | H03M 1/1225 341/141 |
| 8,860,590 B2 * | 10/2014 | Yamagata | ............ | H03G 3/3052 327/141 |
| 9,276,601 B2 * | 3/2016 | Wu | ........................ | H03M 1/02 |
| 9,374,102 B1 * | 6/2016 | Loeliger | ............. | H03M 1/1225 |
| 2011/0102218 A1 * | 5/2011 | Guido | ................. | H03M 1/1225 341/122 |
| 2011/0102221 A1 * | 5/2011 | Guido | ................. | H03M 1/1225 341/141 |

* cited by examiner

*Primary Examiner* — Jean B Jeanglaude
(74) *Attorney, Agent, or Firm* — Schiff Hardin LLP

(57) ABSTRACT

An Analog-to-Digital-Conversion control system includes a first sample and hold circuit configured to provide a first sampled output to be converted by an Analog-to-Digital-Converter, which comprises a first sampling control circuit configured to receive a first trigger information to trigger sampling of a first analog input and to receive a first collision detection information from the Analog-to-Digital-Converter to detect a collision, a first sample and hold stage coupled to the first sampling control circuit and configured to sample the first analog input, only if no collision has been detected by the first sampling control circuit, wherein the first sampling control circuit is further configured to check predefined first sampling criteria and to output a first conversion request to the Analog-to-Digital-Converter, only if the predefined first sampling criteria are fulfilled.

20 Claims, 11 Drawing Sheets

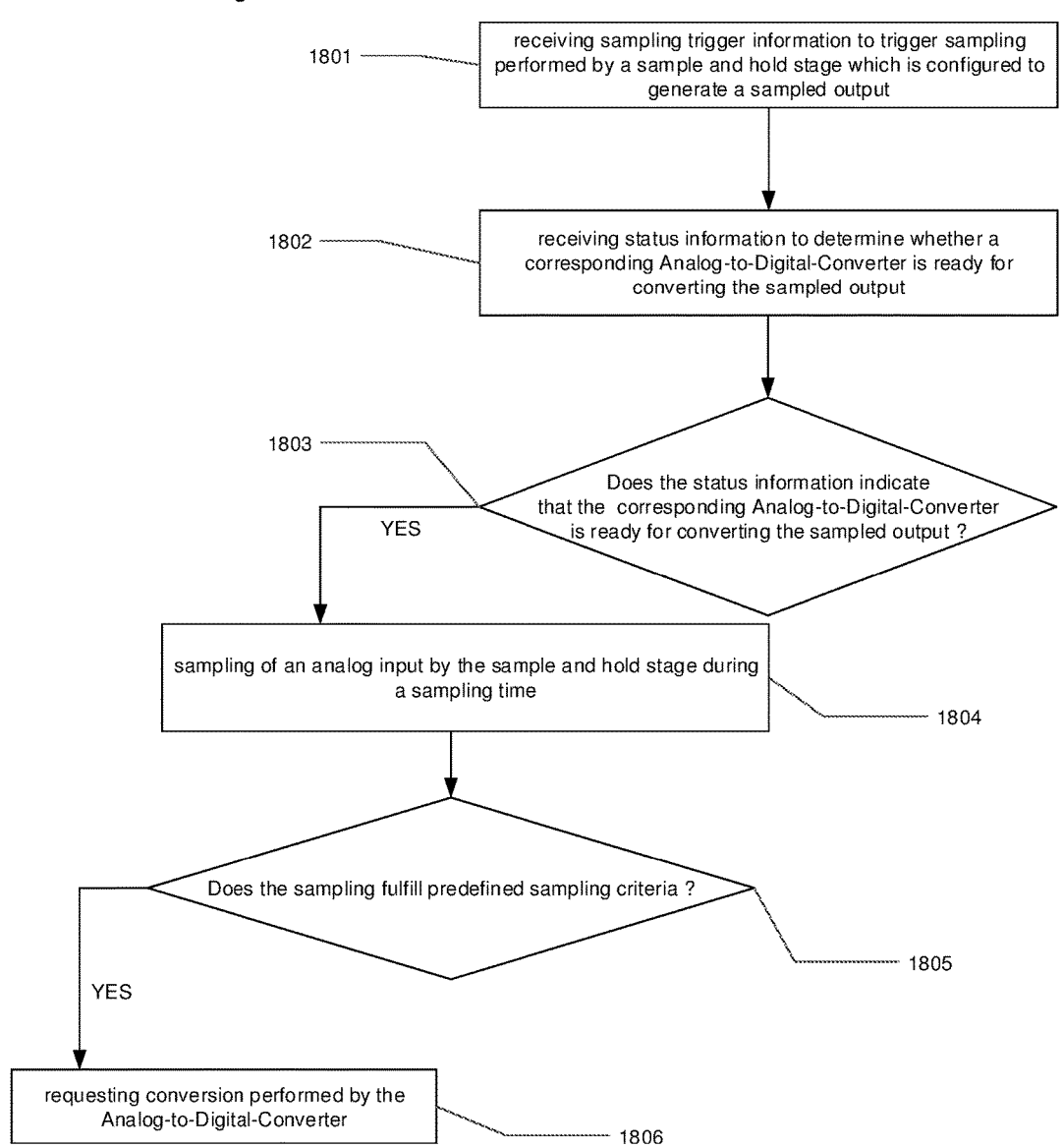

DEVICE AND METHOD FOR REQUESTING AN ANALOG-TO-DIGITAL CONVERSION

BACKGROUND OF THE DISCLOSURE

Embodiments of the present disclosure relate to Analog-to-Digital-Conversion, in particular to a method for requesting an analog-to-digital conversion and a device including a sample and hold module.

Analog-to-Digital-Converters (ADCs) are widely used to convert analog input signals into a numeric data format for further treatment. Typically, ADCs are able to support multiple channels, i.e. multiple input signals can be converted by one ADC in a given timeframe.

A conflict or collision may occur, if multiple conversion requests arise at the ADC at the same time. The U.S. Pat. No. 6,507,298 B1 and U.S. Pat. No. 6,653,963B1 disclose an ADC system including an arbiter. The arbiter checks whether there are requests for conversion of input signals or respective channels and controls the sequence of conversions if there is more than one pending request at a time.

The overall timing of known ADC systems is limited by the time the actual Analog-to-Digital conversion requires.

SUMMARY

A first embodiment relates to a method comprising the following steps: receiving sampling trigger information to trigger sampling performed by a sample and hold stage which is configured to generate a sampled output and receiving status information to determine whether a corresponding Analog-to-Digital-Converter is ready for converting the sampled output. If the status information indicates that the corresponding Analog-to-Digital-Converter is ready for converting the sampled output, the method comprises further steps: sampling of an analog input by the sample and hold stage during a sampling time and, if the sampling fulfills predefined sampling criteria, requesting conversion performed by the Analog-to-Digital-Converter.

A second embodiment relates to a device comprising a first sample and hold module for providing a first sampled output to be converted by an Analog-to-Digital-Converter. The first sample and hold module comprises a first sampling control circuit configured to receive a first trigger information to trigger sampling of a first analog input and further configured to receive a first collision detection information from the Analog-to-Digital-Converter to detect a collision. The first sample and hold module further comprises a first sample and hold stage coupled to the first sampling control circuit and configured to sample the first analog input, only if no collision has been detected by the first sampling control circuit, wherein the first sampling control circuit is further configured to check predefined first sampling criteria and to output a first conversion request to the Analog-to-Digital-Converter, only if the predefined first sampling criteria are fulfilled.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale.

FIG. 18 shows a process flow of a method of generating a conversion request signal in accordance with various embodiments.

DETAILED DESCRIPTION OF THE PREFERRED EMBODIMENTS

The described and discussed embodiments are merely illustrative of specific ways to implement and use the disclosure, and should not be understood to limit the scope.

There are different types of ADCs that can be used depending on their characteristics. ADCs based on the SAR principle (successive approximation register) may comprise a sample and hold circuit to acquire the input voltage, a successive approximation register, a Digital-to-Analog-Converter (DAC) and a comparator. Conventional SAR-ADCs are implemented by having the same timing for the sample and hold stage and for the Analog-to-Digital conversion stage. SAR-ADC implementations may for example use a capacitive array for the conversion. This capacitive array behaves like a sample and hold circuit that has to be loaded to the level of the input voltage signal (sampling phase) before the conversion phase can start.

A SAR-ADC, for example, may support multiple inputs by using an input multiplexer selecting one input signal or respective channel from a group of potential input signals. U.S. Pat. No. 7,492,298B2 discloses a structure including an input multiplexer to select one input signal sampled in a capacitive array to be converted.

Figure 1:
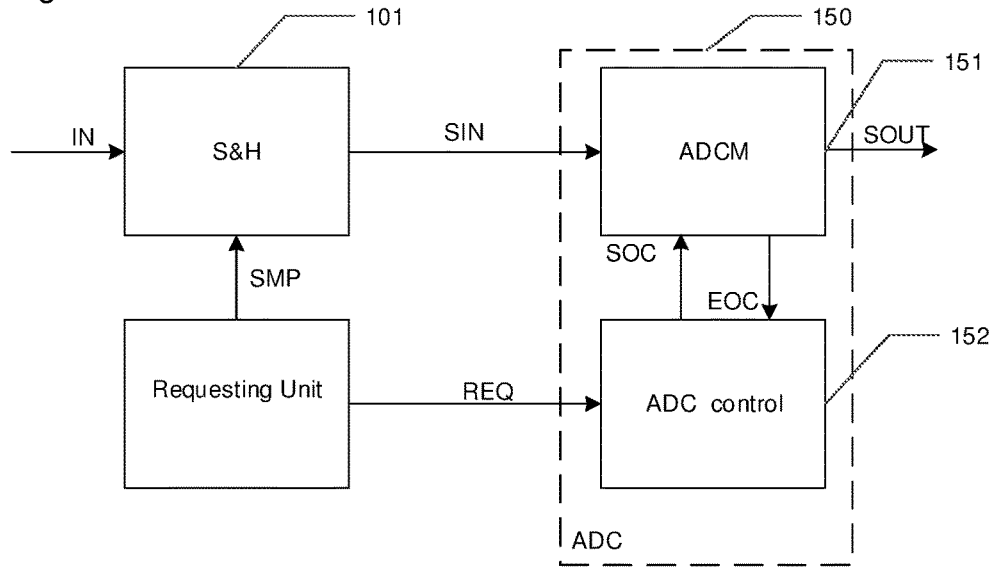
FIG. 1 shows a known Analog-to-Digital-Conversion system.

As an example, FIG. 1 shows a block diagram of an Analog-to-Digital-Conversion system. An analog input signal IN is received by a sample and hold module (S&H) 101 which generates a sampled output signal SIN by sampling the analog input signal IN during a sampling time. The sampling time should be long enough to ensure that the sampled value SIN represents the input signal IN sufficiently accurate. If the input sampling time is too short, the difference between the sampled value SIN and the input value at the end of the sample time may be too big for further processing.

The sample and hold module (S&H) 101 may be controlled by a requesting unit via a dedicated control signal SMP. The requesting unit may be a timer module. The control signal SMP may function as a sample request signal and may be active, i.e. set to a logical 0 or 1, during a corresponding sampling time.

The requesting unit further provides a conversion request signal REQ to the Analog-to-Digital-Converter (ADC) 150. The conversion request signal REQ is received by an ADC control circuit 152, which is part of the ADC 150 and which controls the actual conversion performed by an Analog-to-Digital-Conversion module (ADCM) 151, which forms a part of the Analog-to-Digital-Converter (ADC) 150.

The sampled output signal SIN generated by the sample and hold module 101 is received by the Analog-to-Digital-Conversion module 151. The ADC control circuit 152 and the ADC conversion module 151 may be coupled by dedicated control signals, for instance start of conversion (SOC) and end of conversion (EOC) signals.

In normal operation mode, an Analog-to-Digital conversion is requested by the requesting unit. The request may be split into a sample request signal SMP and a conversion request signal REQ. The ADC control circuit 152 receives the conversion request signal and checks whether the ADC conversion module 151 is available, i.e. not busy with another ongoing Analog-to-Digital conversion.

In case the ADC conversion module 151 indicates that there is no collision, i.e. no other conversion is ongoing, the ADC control circuit 152 may activate the SOC signal. As consequence, the ADC conversion module 151 reads the sampled output signal SIN and converts it into a numerical output value SOUT. If the Analog-to-Digital-Conversion is completed, ADCM 151 may activate the EOC signal.

Figure 2:
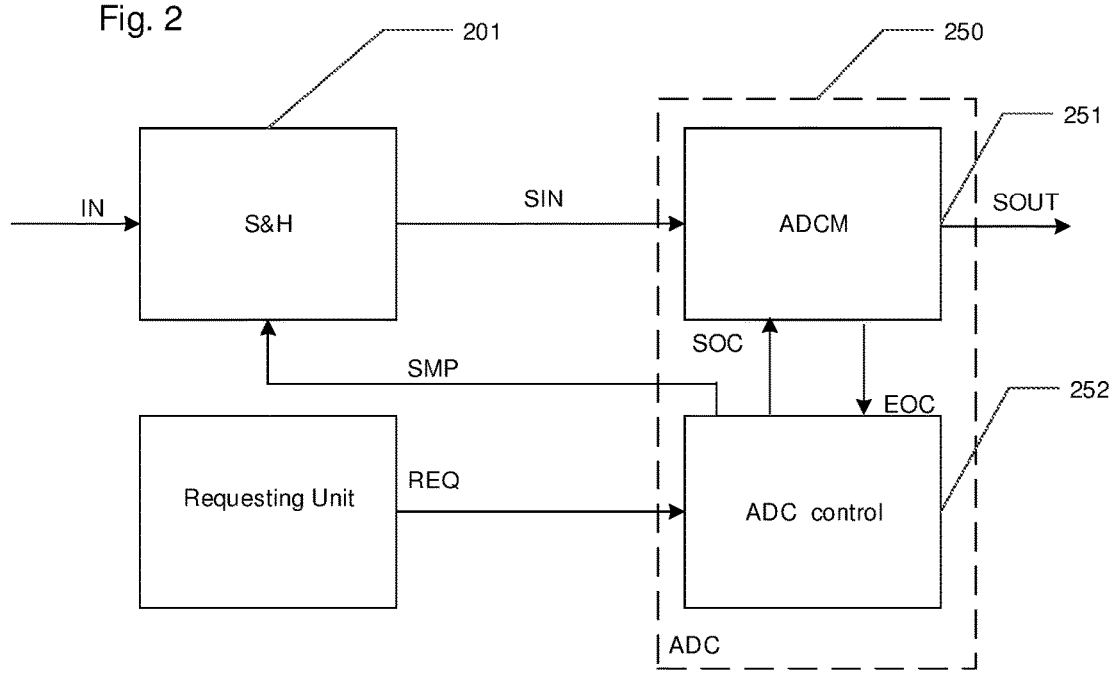
FIG. 2 shows a further known Analog-to-Digital-Conversion system.

FIG. 2 shows a further known exemplary Analog-to-Digital conversion system. In contrast to FIG. 1 the requesting unit generates the conversion request signal REQ only. The ADC 250 receives the REQ signal and generates the sampling request signal SMP for the sample and hold module 201 by itself. If the sampling request is generated by the ADC itself the internal timing of the ADC influences the timing of the S&H stage. This is disadvantageous in many cases.

In various embodiments, an ADC conversion concept may be provided that allows independent timings of an S&H stage and a corresponding ADC.

In various embodiments, an ADC system is provided that may generate an analog-to-digital conversion request only if the corresponding sampling process generated proper data.

Figure 3:
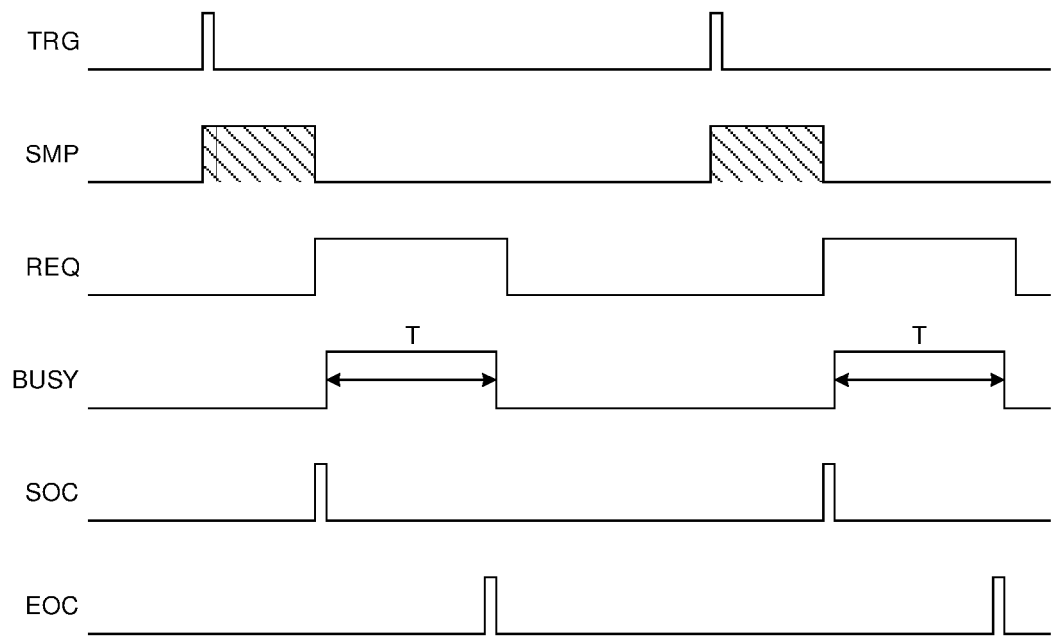
FIG. 3 shows an example of a timing diagram of typical control signals to control a known Analog-to-Digital-Converter.

FIG. 3 illustrates a timing diagram of typically used control signals related to Analog-to-Digital-Conversion systems. After a requesting unit provides a sampling trigger signal TRG, the sampling of an associated analog input signal is started.

It is noted that the sampling process is started with the positive edge of the sampling trigger signal. However, the sampling process can also be triggered by the falling edge of the trigger pulse.

The sampling phase is controlled by signal SMP, i.e. the sampling time is defined by the time between the rising edge of signal SMP and the falling edge of SMP. In FIG. 3 the sampling time is marked by the shaded area at signal SMP.

It is noted that the sampling may also be triggered by a falling edge of signal SMP and that the sampling time may then be defined as the time between the falling edge and the rising edge of signal SMP.

After the sampling process of the analog input signal has been completed, i.e. for instance after the falling edge of SMP, the conversion request signal REQ is activated, which means that signal REQ changes its level from a logical 0 to a logical 1. Although activation in this example is defined by changing the level from 0 to 1 it is noted that REQ may also be activated by changing its level from 1 to 0.

After the conversion request signal REQ is activated, the SOC control signal starts the actual Analog-to-Digital conversion of the sampled input. The conversion phase performed by the ADC is indicated by the busy signal BUSY, i.e. that while the BUSY signal is active, the actual conversion is being done. The conversion time needed by the ADC may be T. As soon as the conversion is completed, the end of conversion is indicated by signal EOC. After a while the entire system is ready to receive the next sampling trigger signal TRG and to sample and convert the next input signal.

The ADC 150 may be a SAR-ADC (Successive Approximation Register) or a Sigma-Delta-ADC or any other type of ADC. The output of the ADCM 151 is a numerical value SOUT, e.g. a digital value that represents the analog input IN.

Figure 4:
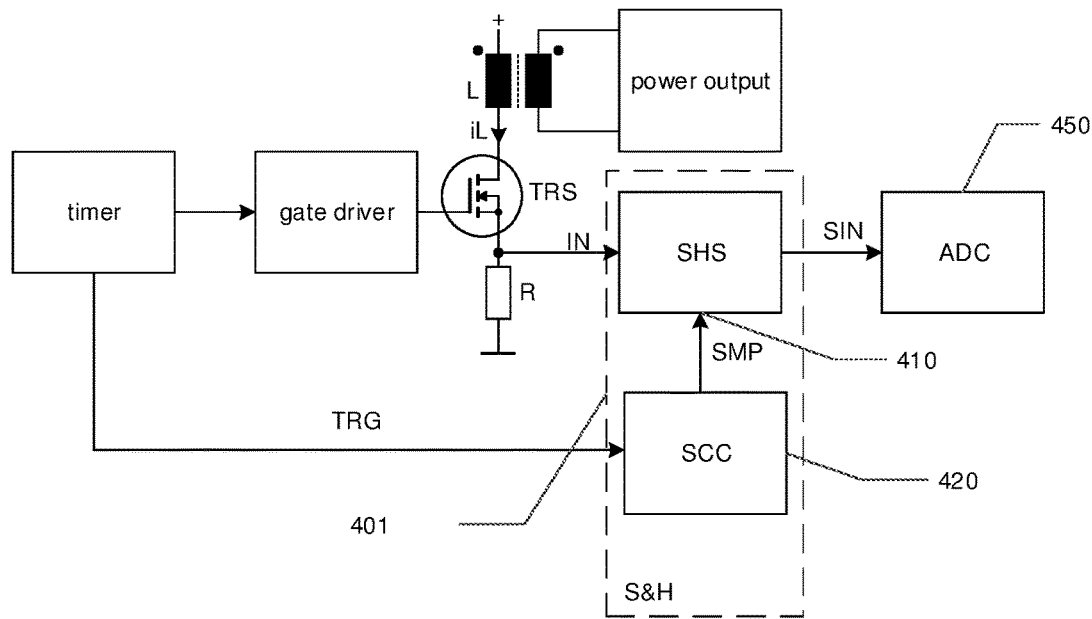
FIG. 4 shows as an application example a switched mode power supply employing a known Analog-to-Digital-Conversion system.

FIG. 4 shows an application example that focus on the time of sampling. In this example of a switched mode power supply it is very important that the input signal IN is exactly sampled when transistor TRS is switched from its on to its off state.

Via a gate driver the transistor is controlled by a timer module which generates as requesting unit the sampling trigger signal TRG to the sample and hold module 401. The sample and hold module 401 comprises a sample control circuit (SCC) 420 which generates the sample request signal SMP in a way that the sample and hold stage (SHS) 410 samples the input signal IN exactly during the required time frame. The sampled output signal SIN is subsequently provided for actual conversion to the ADC 450.

Figure 5:
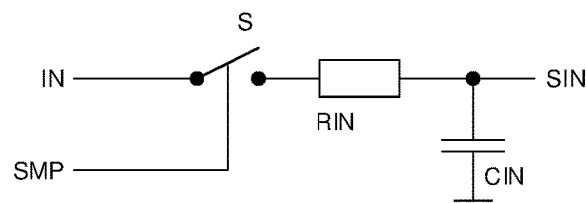
FIG. 5 shows a simplified implementation example for a sample and hold stage.

FIG. 5 illustrates an exemplary known implementation for a sample and hold stage (SHS). The SHS includes a switch S, which is controlled by the sample request signal SMP. During a sampling phase the switch is closed so that a capacitor CIN is loaded by a current running through register RIN. After loading the capacitor to an appropriate voltage level, SIN represents the input signal IN sufficiently accurate. The switch should be closed for a minimum sampling time to ensure that the capacitor is loaded appropriately. The sample and hold stage has two operating modes. If the switch is closed, the stage is in sampling mode. In sampling mode the output value follows the input value, respecting the low-pass behavior due to parasitic elements, such as RIN. If the switch is open, the stage is in hold mode. In hold mode the output is decoupled from the input.

To minimize the RC low-pass filter effect of the S&H stage, the sampling control signal SMP should be active for a minimum sampling time to ensure that output signal SIN is close enough to the input signal IN. A shorter activation of the sampling switch would lead to an increased error and should be avoided. When looking at the treatment of the conversion result, it may be better to skip a conversion of an input signal if the sampling criterion of a minimum sampling time has not been fulfilled. It is very difficult to discard a wrong conversion result later on.

Figure 6:
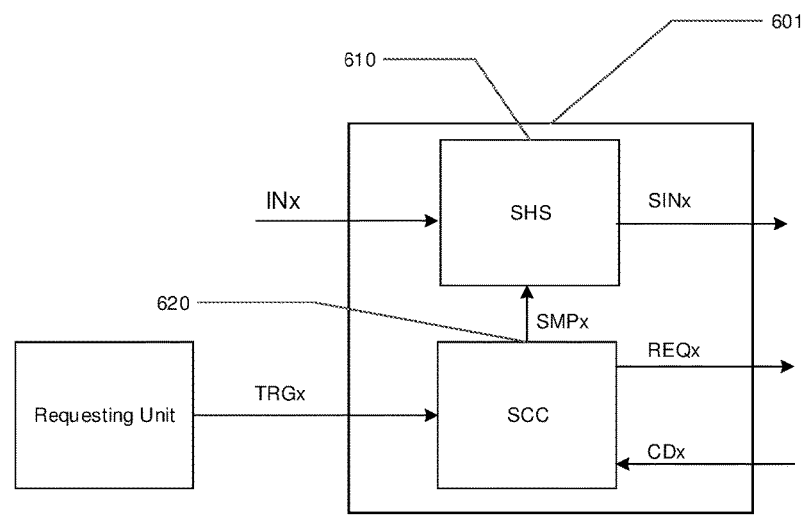
FIG. 6 shows a device according to an embodiment.

FIG. 6 shows a device comprising a sample and hold module 601 for providing a first sampled output to be converted by an Analog-to-Digital-Converter in accordance with various embodiments.

As shown in FIG. 6, the sample and hold module 601 includes a first sample control circuit (SCC) 620 and a first sample and hold stage (SHS) 621. The first SCC 620 and the first SHS 621 are coupled by a sample control signal SMPx. It is noted that there may be other signals used for the coupling as well.

The SCC 620 is configured to receive a first trigger information (TRGx) to trigger sampling of a first analog input (INx). The trigger information may be communicated to the SCC by using certain memory locations, e.g. registers inside the SCC or by using dedicated signals. The SCC 620 may receive a first sampling trigger signal TRGx which may be generated by a requesting unit The requesting unit may be a timer module or a sensor or any other measurement element that requires a conversion of an analog value into a digital value. The trigger signal TRGx may indicate the requirement for sampling by its rising edge or by its falling edge.

The first SCC 620 is further configured to receive first collision detection information from the Analog-to-Digital-Converter (ADC) to detect a collision. The collision detection information may be communicated to the SCC by using certain memory locations, e.g. registers inside the SCC or by using dedicated signals, e.g. a collision detection signal CDx. The detection information may indicate that a related or associated ADC is ready for a conversion, i.e. available for starting a requested conversion which means to enter conversion mode. If the ADC is busy with a conversion of a previously sampled input value SINx, the value of SINx must be held as constant as possible to avoid corruption of the conversion result. This implies that a new sampling phase must not be started while the ADC is still converting SINx.

The first sample and hold module 601 further comprises a first sample and hold stage (SHS) 610, which is coupled to the first sampling control circuit (SCC) 620 and configured to sample the first analog input, only if no collision has been detected by the first SCC 620. The information of the availability of the corresponding ADC to convert a sampled value is therefore communicated from the SCC 620 to the SHS 610. The SHS 610 uses the information on the ADC-readiness to decide whether a sampling process should start or not.

The first SCC (620) is further configured to check predefined first sampling criteria and to output a first conversion request to the Analog-to-Digital-Converter, only if the predefined first sampling criteria are fulfilled.

In case the corresponding or associated ADC is still busy (i.e., not ready for conversion), or, in other words, the ADC is still in the process of converting a previously sampled input, the first SCC 620 may not provide a sampling request signal SMPx.

The first sampling control circuit (SCC) 620 is therefore configured to activate the sample request, e.g. in form of signal SMPx, if no collision is determined. It is noted that the sampling request may also be communicated by using registers inside the ADC or any other memory location controlled by the ADC.

The first sampling control circuit 620 is further configured to generate a conversion request, e.g. in form of signal REQx, only if the first sampling and hold stage 610 provides a first sampled signal that fulfills predefined sampling criteria. It is noted that the conversion request may be communicated to the ADC by using certain memory locations, e.g. registers inside the ADC or by using a dedicated signal.

The first sample and hold stage (SHS) 610 is configured to sample an input signal INx during a first sampling time, e.g. SHS 610 receives an analog input signal INx and samples this input signal during a timeframe defined by the sample control signal SMPx.

The timeframe may be defined by the time between a rising and a falling edge of SMPx, or between two rising edges of SMPx, or between two falling edges of SMPx.

The sampling process provides sampled data SINx only, if predefined first sampling criteria are fulfilled. The predefined first sampling criteria include a minimum sampling time and/or a valid time window for the sampling process and/or other characteristics related to the sampling trigger signal or the analog input signal.

If the sampling process generates valid sampled data, i.e. the predetermined first sampling criteria have been fulfilled, for example by using a minimum sampling time, the first SHS 610 provides the sampled signal SINx and the first ample control circuit SCC 620 provides a conversion request, e.g. by providing signal REQx.

The sampling of the analog input signal provides a result which is only further processed and provided if the sampling time exceeds a minimum threshold. If the sampling time is too short the result of the sampling process will be discarded. The end of the sampling window is defined by the sampling control signal SMPx. The timing of the sample and hold module 601 is totally independent from the timing of a corresponding ADC. The sample and hold module 601 only provides a conversion request, e.g. by a signal REQx, and a sampled signal SINx if predetermined sample conditions are fulfilled. As said, these sample conditions may, for example, include a minimum sampling time.

In various embodiments, the predefined sampling criteria may include a valid time window, i.e. timeframe for the sampling window. The requesting unit, for instance, may indicate a possible start of sampling by the falling or rising edge of an associated TRGx signal. However, there might be a maximum predetermined delay between the sampling trigger signal TRGx and the actual start of the sampling process controlled by the sampling control signal SMPx. In one example, the sampling process cannot be started because the corresponding ADC is still in the process of analog-to-digital conversion of the previous sampled input for the respective channel.

If the delay between the sampling trigger and the start of the sampling exceeds a predetermined threshold, this specific sampling criterion is not fulfilled and the sample and hold module 601 may not provide any conversion request signal or sampled input signal.

In various embodiments, the first sample control circuit 620 is further configured to provide a first timestamp indicating the time of sampling. This information may also be defined as a predefined sampling criteria, i.e. that a sampled output value is not valid if the timestamp exceeds a certain limit, i.e. is outdated, which means too old for further processing.

Figure 7:
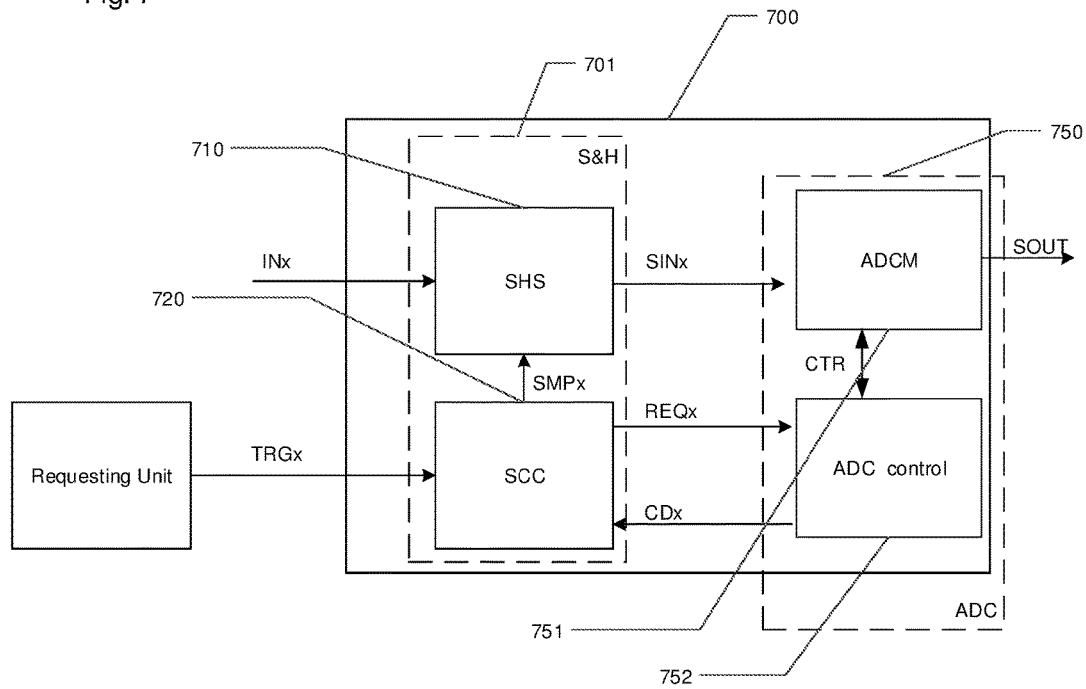
FIG. 7 shows a further embodiment including an Analog-to-Digital-Converter.

FIG. 7 shows a further exemplary embodiment which adds the functionality of an Analog-to-Digital-Converter (ADC) to the sample and hold module (S&H) of FIG. 6. In various embodiments the ADC conversion system 700 may include a sample and hold module 701 and a corresponding ADC 750. The sample and hold module 701 may implement the described functionality of element 601, i.e. smart generation of an sampled output signal SINx and a corresponding conversion request, e.g. by providing signal REQx, if predetermined or predefined sample criteria are fulfilled. These signals are received by the ADC 750.

The ADC 750 is therefore configured to receive a sampled output signal SINx and is further configured to convert the sampled output signal SINx into an output value SOUT if a conversion is requested. The request for converting a sampled, but still analog input, into a digital value is indicated by the received conversion request, e.g., by using signal REQx.

The ADC 750 includes an ADC control circuit (ACC) 752 and an ADC conversion module (ADCM) 751. The ACC 752 receives the conversion request signal REQx and provides ADC status information in form of a collision detect signal CDx to inform the SCC 720 about the operating status of the ADC 750.

The ADC control circuit 752 is therefore configured to receive the conversion request signal REQx and is further configured to provide a collision detection signal CDx to indicate whether a collision is detected. Collision means that the ADC is currently busy with a conversion of a previously sampled input. The collision detection signal CDx therefore indicates whether the ADC is in conversion mode.

If the conversion module ADCM 751 is in the stage of converting a sampled output signal into an output value SOUT, i.e. the ADC is still busy, the collision detect signal CDx is active. It is noted that an active CDx signal may be represented by a logical 0 or a logical 1. The collision detect signal CDx indicates to the sample and hold module 701 that the ADC is currently busy, i.e. that an analog-to-digital conversion process is still ongoing. This information is used by the sample control circuit 720, because there will be no sample request signal SMPx activated, as long as the corresponding ADC is busy with the associated channel.

The ADC control circuit 752 and the ADC conversion module 751 are coupled by multiple control signals CTR which can be used to exchange status messages. CTR may include s trigger to start the analog-to-digital-conversion or indicate the end of processed conversion. In traditional systems several functional units, such as timers, digital input stages or other ADCs may request a conversion of an input signal or a specific channel respectively. As a consequence, the ADC has to include a mechanism to cope with a plurality of requests coming from different requestors, selecting an input and then starting a conversion.

Figure 8:
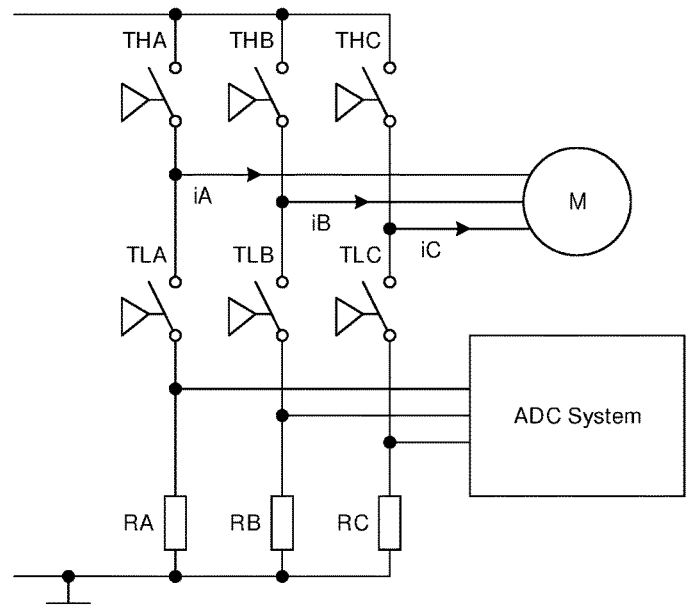
FIG. 8 shows an application example employing Analog-to-Digital-Conversion of three analog input signals which have to be converted at the same time.

FIG. 8 shows an application example of an electric motor control system. The motor M is basically controlled by three currents and their related complex phases. A digital control of the motor characteristics is typically being handled using an Analog-to-Digital-Converter system. In such an ADC system all three currents have to be converted basically at the same time. The three shunt resistors Rx are used to measure the phase currents iA, iB and iC. The switches and gate drivers of the power inverter stage are labeled TLA, TLB and TLC for the low-side switches and THA, THB and THC for the high-side switches. In this example 1 requesting unit provides three sampling trigger signals to the ADC system. The ADC system may include only one analog-to-digital conversion module that should handle the conversion of all three input channels at basically the same time One example to handle multiple conversion requests by using one ADC only, is the deployment of on arbiter. Generally, all possible requesters for conversions have to be handled by the arbiter which might be part of the ADC. This leads to a high effort in the ADC and increased complexity, especially if a requestor requests parallel sampling of more than one input signal or channel.

In case of multiple conversion requests, the deployment of multiple S&H stages is possible. If multiple S&H stages are used, each of these stages has to be synchronized to the internal timing of the ADC to achieve the same sampling timing for the input signals. This increases design effort and complexity in the construction of the ADC. A disadvantage of these structures is that the ADC internal timing defines the sampling timing of the input signals.

Figure 9:
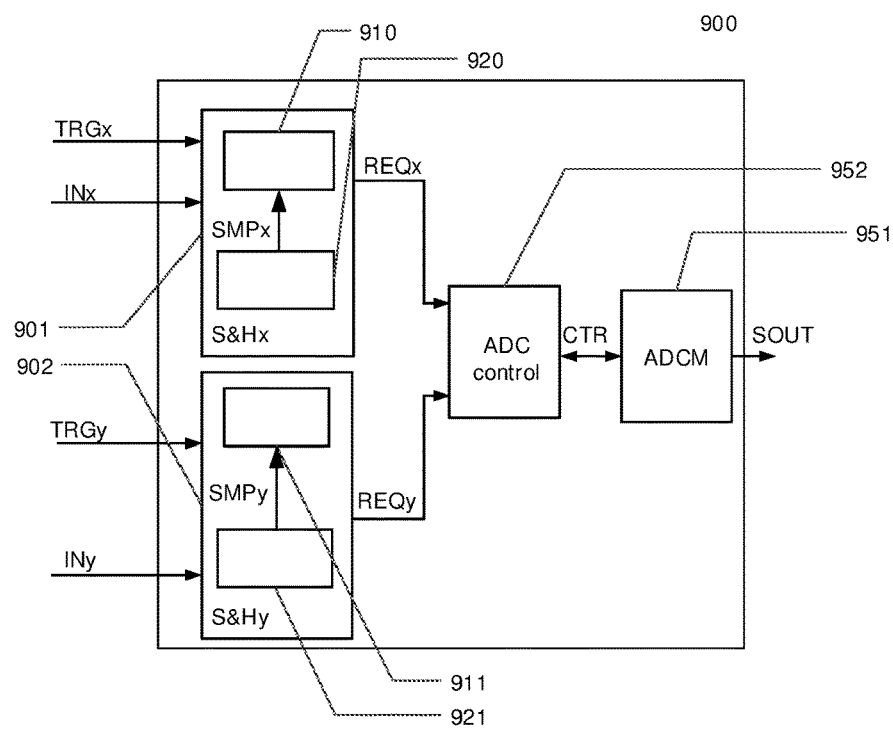
FIG. 9 shows a further embodiment including multiple sample and hold modules.

FIG. 9, for instance, illustrates a further embodiment. In various embodiments, the ADC system 900 may receive multiple inputs, e.g. two input signals (INx, INy) and corresponding sampling trigger, e.g. in form of trigger signals (TRGx, TRGy) from associated requesting units. It is noted that there may also be a single requesting unit that provides multiple sampling trigger signals and/or corresponding input signals for the ADC system.

System 900 includes two sample and hold modules 901 and 902 whereas the sample and hold modules may be implemented as the sample and hold module of FIG. 6. Each of these modules comprises a sample control circuit (920 or 921) and a sample and hold stage (910 or 911) which are coupled by a corresponding sampling request signal (SMPx or SMPy).

The sample and hold modules (901, 902) receive corresponding input and sampling trigger signals and provide associated conversion request signals REQx or REQy, respectively. The functionality to provide these conversion request signals is the same as described for FIG. 6.

The ADC conversion system 900 includes a first sample hold module 901 and a a second sample and hold module 902. The second sample and hold module provides a second sampled output SINy to be converted by the Analog-to-Digital-Converter into a digital value. The second sample and hold module further comprises a second sampling control circuit 921 configured to receive a second trigger information, e.g. by a signal TRGy, to trigger sampling of a second analog input INy. It is further configured to receive second collision detection information, e.g. by signal CDy, from the corresponding Analog-to-Digital-Converter to detect a collision.

The second sample and hold module further includes a second sample and hold stage 911 coupled to the second sampling control circuit 921 and is further configured to sample the second analog input. However, the sampling is only performed if no collision has been detected by the second sampling control circuit. A collision may occur if a conversion of an input of the same channel is ongoing.

The second sampling control circuit 921 is further configured to check predefined second sampling criteria and to output a second conversion request to the Analog-to-Digital-Converter, only if the predefined second sampling criteria are fulfilled. If the predefined sample criteria are not fulfilled, no conversion request, e.g. in form of a signal REQy, will be issued.

The Analog-to-Digital-Converter (ADC) may comprise an Analog-to-Digital-Conversion Module 951 configured to convert a selected sampled output into a digital value. The selected sampled output may be one of the sampled outputs SINx or SINy.

The ADC further comprises an Analog-to-Digital-Conversion control circuit 952, which may be configured to receive the first conversion request and further configured to provide the first collision detection information to indicate whether a collision is detected.

The Analog-to-Digital-Conversion control circuit 952 is further configured to receive the second conversion request, to provide the second collision detection information, and to select one of the first and second conversion request according to a predefined arbitration scheme.

The ADC control circuit 952 may also provide the functionality of an arbiter. It one embodiment, the ADC control circuit 952 receives both conversion request signals and arbitrates according to predetermined arbitration criteria. These criteria may include a fixed priority scheme, which means that each of the request signals corresponds to a predefined priority.

In a further example the ADC control circuit 952 may use an arbitration scheme according to a round Robin arbitration mechanism, which means that corresponding request signals will be served sequentially.

Figure 10:
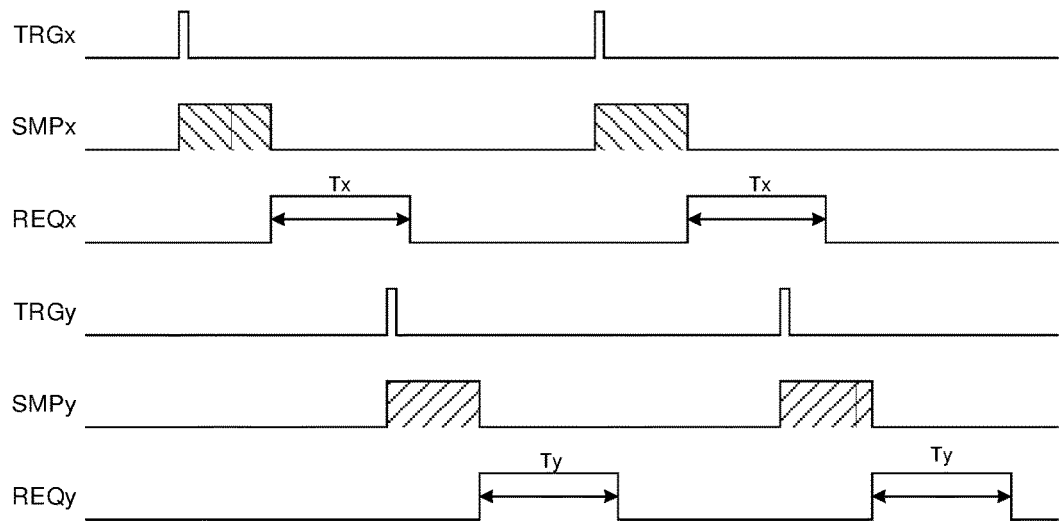
FIG. 10 shows a timing diagram illustrating a non-collision example of control signals which are used with one known Analog-to-Digital-Converter to convert two input signals.

FIG. 10 shows a timing diagram for the case that two requesting units provide respective sampling trigger signals (TRGx and TRGy) to request Analog-to-Digital-Conversions of their respective inputs or channels. As in the previous examples, the corresponding sampling control signals SMPx and SMPy indicate the sampling request of the respective channel x or y.

After sampling is completed, which is indicated by the falling edge of SMPx, and a valid sampled input has been generated, the conversion request signal REQx is activated and an analog-to-digital conversion of channel x is being performed. The conversion time is denoted with Tx that represents the time until the REQx signals changes its level back to logical 0.

It is noted that the conversion request signal REQx is only generated if predetermined sampling criteria or sampling conditions are fulfilled. These sampling conditions may include a minimum sampling time, a valid time window for the sampling or any other criteria that have been predefined to decide whether the sampling process generated valid data.

The valid time window may be defined by two dedicated points in time. After or during sampling an analog input signal, it can be checked if the sampling occurred or is occurring between these predetermined points in time.

In FIG. 10 a conversion is requested by the rising edge of REQx after providing a valid sampled input. During the conversion of the respective input of channel x, the input of the other requesting unit is being sampled which is indicated by the sample request signal SMPy.

After sampling the second channel, i.e. channel y, the corresponding conversion request signal REQy is activated and the sampled channel y input signal is being converted during the timeframe Ty.

While the conversion of channel y is still ongoing, another sampling trigger signal TRGx from channel x is received and the corresponding sampling process to sample the input of channel x indicated by SMPx is started.

The actual analog-to-digital conversion of the newly sampled channel x related input starts with the rising edge of the conversion request signal in REQx. The conversion can actually being performed because the previous conversion has been completed and the corresponding ADC conversion module is no longer busy with converting the input of channel y.

Figure 11:
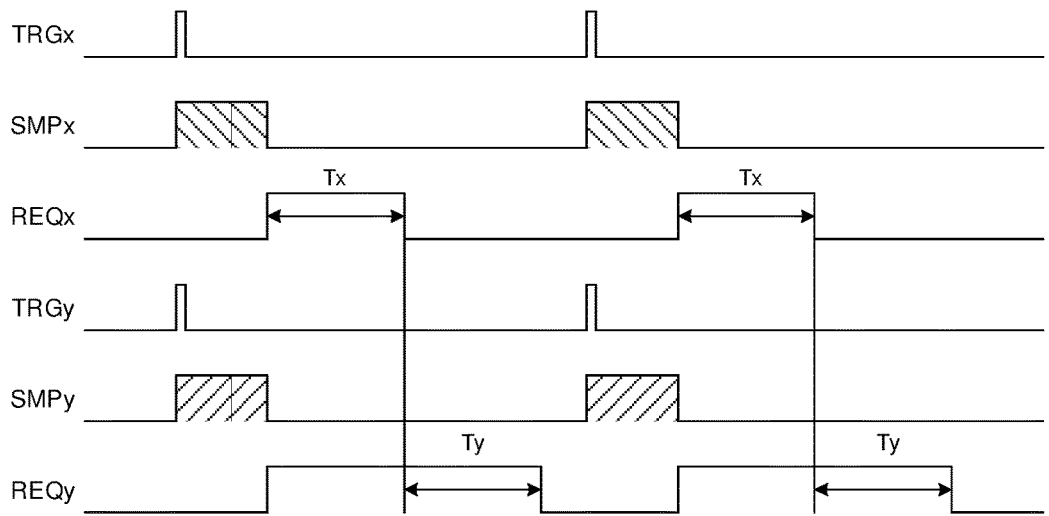
FIG. 11 shows a timing diagram illustrating an arbitration example of control signals which are used with one known Analog-to-Digital-Converter to convert two input signals.

FIG. 11 illustrates a timing diagram for the case that two sampling trigger signals show up at the same time which might be called a collision of inputs. With the sampling trigger signal TRGx of the first channel x the sampling process starts as indicated by the rising edge of SMPx. The same functionality occurs for the second sampling trigger signal TRGy from channel y. The sampling process to sample the input signal from the corresponding channel y is started indicated by sampling control signal SMPy.

In case the sampling conditions are fulfilled for both channels, the corresponding conversion request signals REQy and REQy will be activated. However, as one ADCM can only convert one input at a time, arbitration functionality have to be provided to arbitrate between the two request signals.

In the example of FIG. 11 channel x got a higher priority assigned so that channel x will be served first, i.e. that during a timeframe Tx the sampled input SINx from channel x will be converted. As soon as the conversion is completed, channel y will be served, i.e. that during time Ty the input of channel y will be converted by the ADCM. After the inputs of channel x and y have been served by the ADC, the overall system is ready to process further sampling trigger signals and to convert the next corresponding inputs from channel x and or y.

Figure 12:
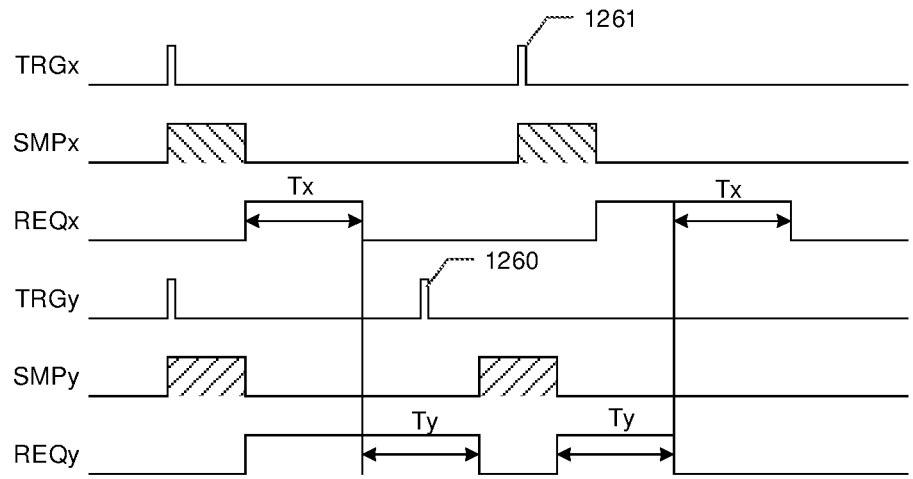
FIG. 12 shows a timing diagram according to an embodiment.

FIG. 12 illustrates a timing diagram of a further embodiment according to another collision example. Again, two simultaneous conversion requests of channel x and channel y occur at the same time. The corresponding analog input signals are being sampled and corresponding conversion request signals REQx and REQy are being generated, because predetermined sampling conditions are fulfilled for both channels.

It is noted that the predetermined sampling conditions may be different for the multiple channels, i.e. the sampling conditions may be channel specific. One sampling condition may include a minimum sampling time. This minimum sampling time can be different for channel y and channel y. A further sampling condition may include a valid time window for sampling which can also be different, i.e. dedicated to a certain channel.

If the analog-to-digital-conversion of the analog input associated with channel x is completed after Tx, the conversion of the analog input associated with channel y is started during Ty. Although in general the conversion times will be identical, the conversion times Tx and Ty may also be different.

During conversion of channel y in time Ty, i.e. while the ADC conversion is in progress, a second sampling trigger pulse (1260) for channel y occurs. This additional sampling trigger 1260 of channel y does not immediately start a new sampling process of its associated input channel y, because the ADC is still busy with servicing the previous sampled input of channel y, i.e. an ADC collision occurred.

Because of a detected collision at the ADC, or ADCM respectively, the sampling of channel y is being delayed. After the conversion of channel y has been completed, indicated by the falling edge of signal REQy, the sampling process of the analog input signal INy of channel y is started which is indicated by the rising edge of signal SMPy.

If the sampling of channel y is successful, i.e. that predefined sampling criteria are fulfilled, the conversion request signal REQy is being activated again. Because no conversion is currently ongoing for channel y, the conversion of channel y is now being performed.

During the sampling of channel y, i.e. of the respective input signal, a further sampling trigger pulse (1261) of channel x is being received. While the conversion of channel y is ongoing, channel x is being sampled in parallel. It is noted that a conversion of a first channel can be performed in parallel to sampling a second channel.

If the sampling of channel x provided a valid sampled input, the corresponding conversion request signal REQx is activated again. However, because the conversion of input channel y is still ongoing, the conversion of channel x cannot directly be started. After the conversion of channel y has been completed, the sampled input SINx can be converted.

Figure 13:
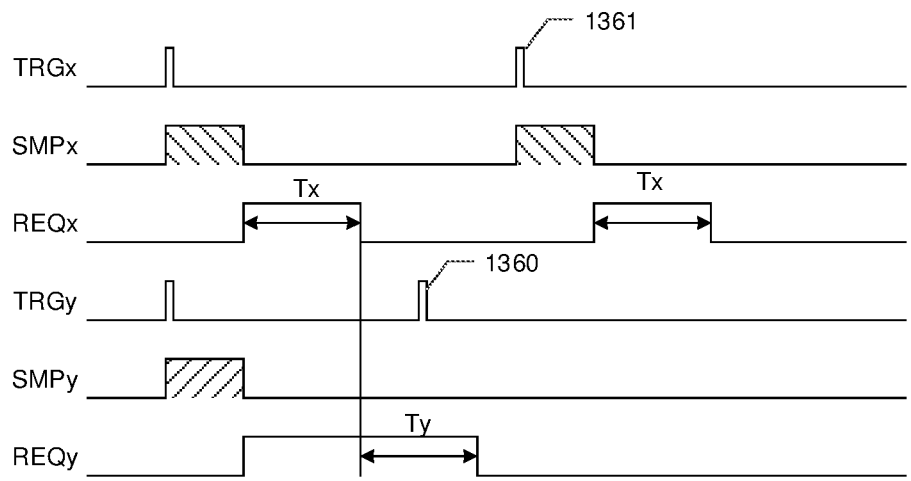
FIG. 13 shows a further timing diagram according to a further embodiment.

FIG. 13 illustrates a timing diagram of a further embodiment according to another collision example. Similar to FIG. 12 two channels provide conversion request signals and their associated inputs are converted subsequently. The second sampling trigger signal TRGy 1360 of channel y occurs while the previous input of channel y is being converted, i.e. during time period Ty.

As sampling of channel y is only possible after the conversion of channel y has been completed, the earliest point in time to sample the new input of channel y would be at the time indicated by the falling edge of the conversion request signal REQy. In the case of FIG. 13 the delay between the sampling trigger 1360 and the falling edge of REQy is too big, therefore no sample request signal SMPy is generated. In other words, the corresponding sample criterion for channel y is not fulfilled. The sample criterion is, for example, a maximum delay between the sampling trigger signal and the start of the sampling for the associated analog input signal. It is noted that the relevant sampling trigger for the mentioned delay may be the rising edge or the falling edge of the sampling trigger signal. In FIG. 13 the sampling criteria for channel y do not provide a valid sampled input.

Figure 14:
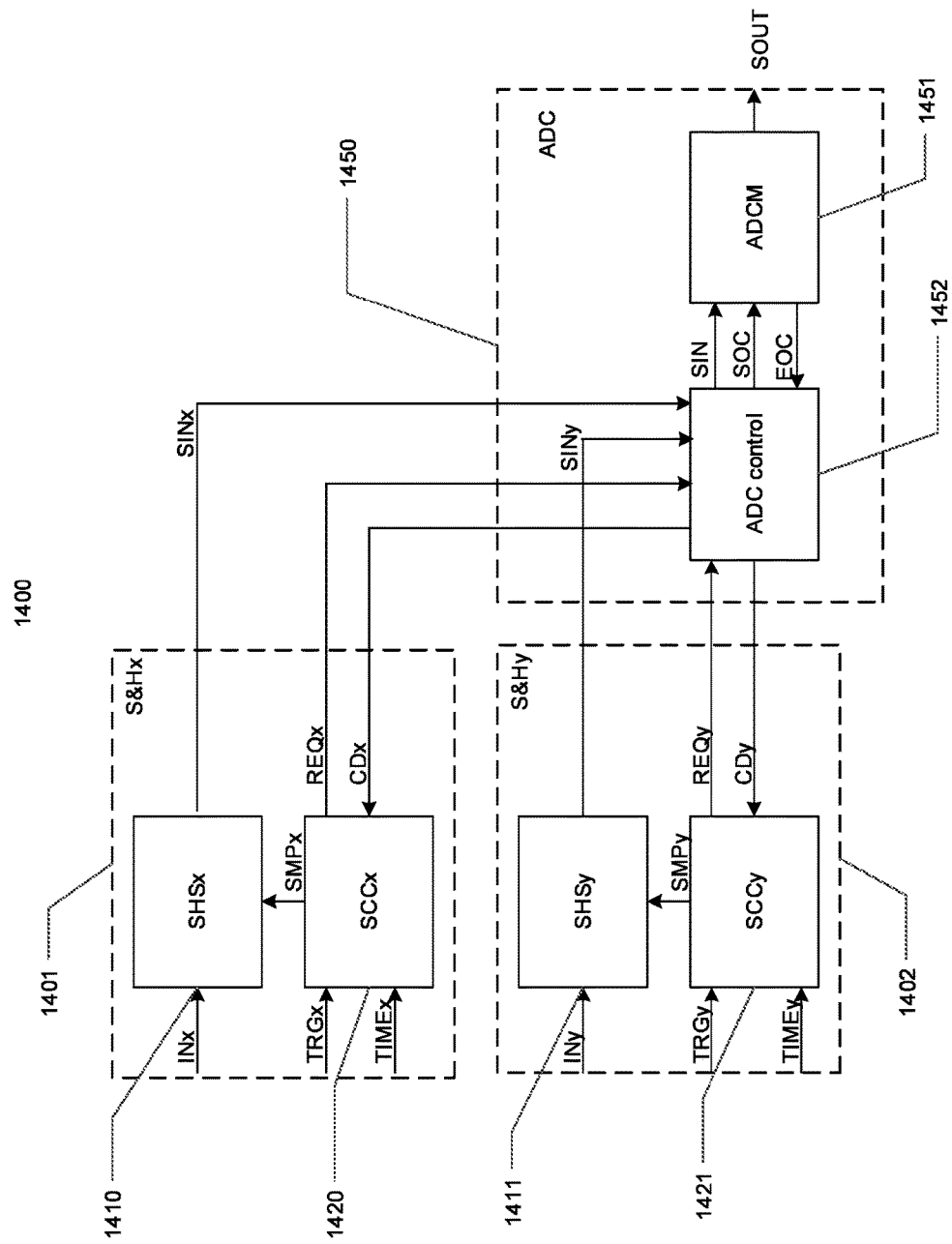
FIG. 14 shows a block diagram according to an embodiment which includes two sample and hold modules and an Analog-to-Digital-Converter.

FIG. 14 shows a block diagram of a further embodiment. In various embodiments, the ADC conversion system 1400 may include two sample and hold modules (S&Hx, S&Hy) and one Analog-to-Digital-Converter (ADC). Each of the sample and hold modules provides a dedicated conversion request signal and a sampled output signal (SINx, SINy) to the ADC.

It is noted that the sample and hold modules provide conversion requests, e.g. in form of signals, only if the corresponding sampling process provided valid sampled data. In cases when there is a sampled output which is invalid, e.g. not fulfilling predefined sampling criteria, no conversion request will be issued.

The validity of the sampled data and/or the sampling process is defined by predetermined sample criteria. The sample criteria may include a threshold for a minimum sampling time, a valid time window for the sampling process, any characteristics assigned to the input signal (e.g. maximum frequency), characteristics of the sample and hold stage (e.g. voltage level of a loaded capacitor), characteristics of the sampling trigger signal (e.g. slope characteristics), characteristics of the sample control circuit or any other characteristics related to the sample and hold module.

It is noted that the predefined sampling criteria are predefined in the sense of initially predefined. During operation the predefined sampling criteria may be updated or amended, e.g. according to characteristics of internal or external events or measured data. In one embodiment, the minimum necessary sampling time may be decreased if the number of number of invalid data increases and vice versa.

The ADC 1450 includes an ADC control circuit (ACC) 1452 and an ADC conversion module (ADCM) 1451. The ACC 1452 receives sampled input data (SINx, SINy) from the sample and hold stages as well as corresponding conversion request signals (REQx, REQy). The ACC 1452 provides corresponding collision detection signals (CDx, CDy) to the sample and hold stages. A collision detection signal (CDx or CDy) which is related to a corresponding channel x or y, is being set, if the ADC 1450 is in the process of converting a sampled input data of the respective channel. The collision detection signal provides the information to the sample and hold stage whether the sampling process of the newly arrived input data can be started for this respective channel. It is noted that the first channel (e.g. channel x) can be sampled while a second channel (e.g. channel y) is being converted.

The ACC 1452 implements an arbitration mechanism and provides a selected sampled input SIN to the ADCM 1451 for actual conversion. Additionally, ACC 1452 provides a start of conversion signal SOC to the ADCM 1451 to initiate the actual analog-to-digital conversion.

The ADCM 1451 implements the actual analog-to-digital conversion and provides a converted output value SOUT as well as an indication that the conversion has been completed using signal EOC. The ADCM 1451 may be implemented by SAR-ADC circuit, a Sigma Delta ADC circuit or any other kind of analog to digital conversion circuit.

Each of the sample and hold units (S&Hx, S&Hy) include corresponding sample control circuits (SCCx, SCCy) and sample and hold stages (SHSx, SHSy). The sample control circuits receive collision information (CDx, CDy) from the ACC 1452.

One main advantage of the topology with independent S&H stages is given by the fact that the S&H timing and the ADC conversion timing is completely decoupled, i.e. relate to different clock nets.

The sampling control circuits (SCCx, SCCy) may ensure that a minimum sampling time is respected (signals SMPx and SMPy indicate the length of the sampling phase). In one operating mode, a sampling trigger signal (TRGx) can start a timer which activates the sampling switch for a given time interval. At the end of the sampling phase, an analog-to-digital conversion can be requested and started (SOC=start of conversion).

The conversion request may get cancelled after the requested conversion is finished (EOC=end of conversion) and signaled back by CDx.

It is noted that the embodiment of FIG. 14 illustrates a very simple handshake scheme. In this embodiment the collision detection signals are asserted (i.e. activated or set) while the related channel of the ADC is actually converted. Other signaling schemes are also possible.

In addition to a sampling trigger signal, each of the sample control circuits receives a corresponding time signal (TIMEx, TIMEy). These time signals may define a time base for the corresponding channel. The time signals may also be used to define a time window which is being used to inform the SCC about a valid timeframe for sampling. For example could the time signals be set or asserted to mark the beginning of a valid time window, while the falling edge of the time signal may mark the end of the valid time window.

Figure 15:
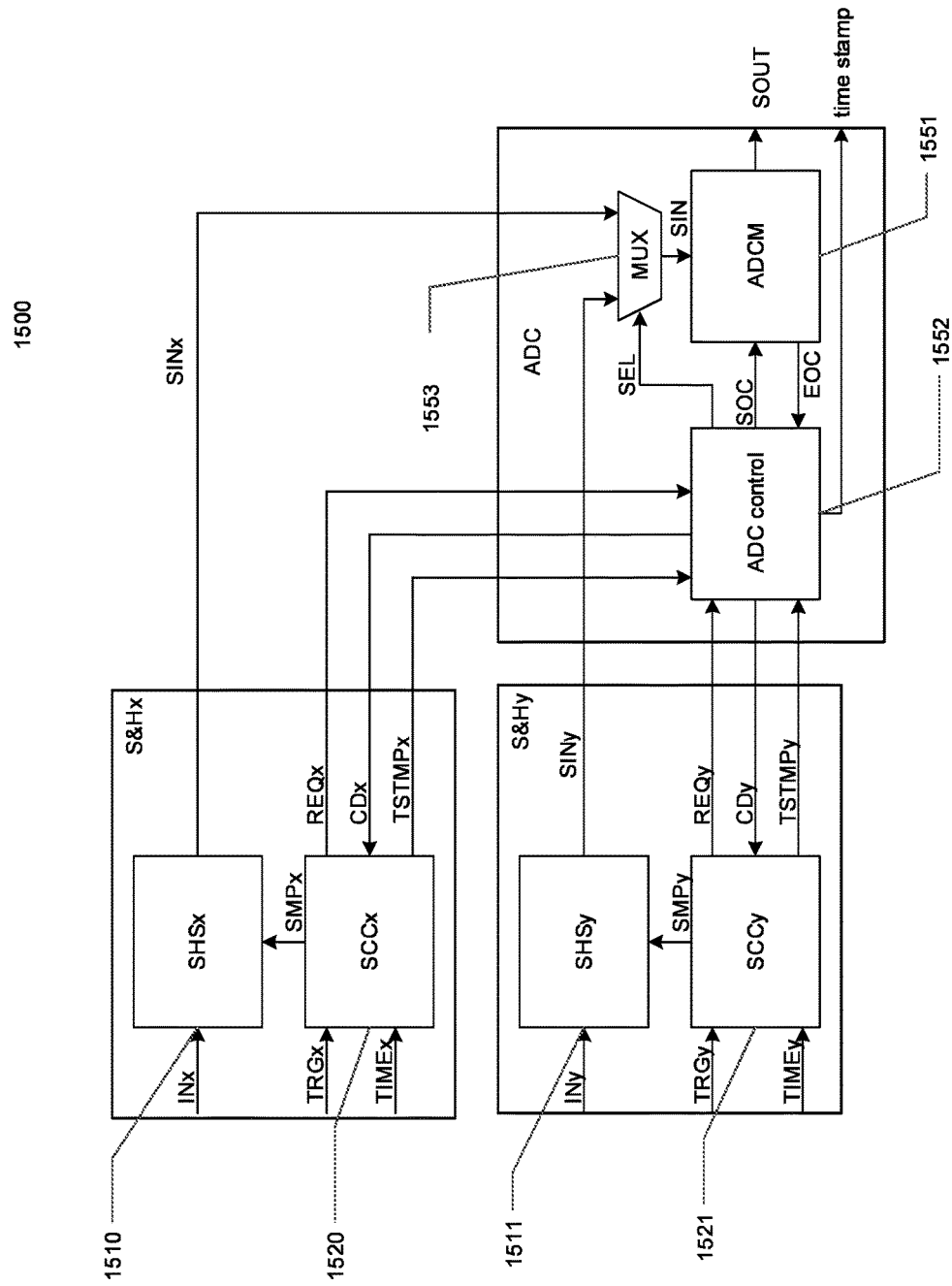
FIG. 15 shows a further block diagram according to an embodiment which includes two sample and hold modules and an Analog-to-Digital-Converter.

FIG. 15 shows another embodiment of an ADC conversion system. The system 1500 comprises two sample control circuits (1520, 1521), wherein the first sample control circuit (1520) is further configured to provide a first timestamp (TSTMPx) and wherein the second sample control circuit (1521) is further configured to provide a second timestamp (TSTMPy). System 1500 may also include an Analog-to-Digital-Conversion control circuit 1452 which is configured to receive the first and second timestamp for further processing.

With these timestamp signals each sampling process is marked with timing information that defines the time of sampling. The timestamp may contain information about the real endpoint of the sampling window and allows combining related samples from different sample and holding stages.

The ADC conversion module (ADCM) 1551 does not have any information about the sampling processes. The ADC control circuit (ACC) 1552 receives these timestamp signals and may store the time information about the sampling process. The Analog-to-Digital-Converter ADC is able to attach the timestamp in addition to the generated output value SOUT.

In the example of FIG. 15 the ACC 1552 provides a select signal SEL which is fed to a multiplexer MUX. This select signal SEL identifies which of the connected sample and hold modules is being selected for conversion. In other words, according to an arbitration scheme (e.g. defined priorities, Round Robin) the select signal will be asserted. This select signal controls a multiplexer MUX which receives the sampled input signals (SINx and SINy) from the respective sample and hold modules (S&Hx and S&Hy). The output of the multiplexer MUX is the selected sampled output signal SIN which is actually converted into a digital output value SOUT by the conversion module (ADCM) 1551.

Figure 16:
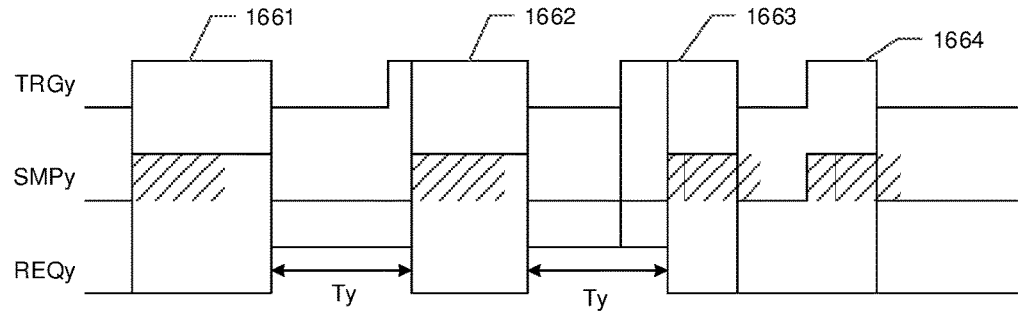
FIG. 16 shows a timing diagram illustrating correct and too short sampling phases.

FIG. 16 shows a timing diagram related to a further embodiment. As in previous examples a sampling trigger pulse 1661 is being received for channel y. The corresponding sampling process starts with the rising edge of sampling control signal SMPy. In contrast to previous examples, the endpoint of the sampling window is now triggered by the falling edge of the sampling trigger pulse 1661.

As it can be seen, the sampling of the first input provides as valid sampled input because the pulse 1661 is long enough, or in other words, exceeds the shaded area that defines the minimum sampling time for channel y. As consequence, the rising edge of conversion request signal REQy indicates a subsequent conversion of this validly sampled input during the time Ty.

The sampling of a new input value at channel y is triggered by the next sampling trigger pulse 1662. Sampling of the respective input channel starts immediately after the conversion process of the previous channel y input has been completed. Again, the falling edge of sampling trigger pulse 1662 marks the end of the corresponding sampling window. As illustrated in FIG. 16 by the shaded area, the length of both sampling trigger pulses (1661 and 1662) is longer than the necessary minimum sampling time.

While the second input data is converted, a third sampling trigger impulse 1663 of channel y is received. As conversion of the previous sampled input is still ongoing, the sampling of the third respective input can only start with the falling edge of REQy. Because of the minimum sampling time, the shaded area exceeds the falling edge of the sampling trigger pulse. Because of the late start of sampling, the sampling window is not yet closed when the falling edge of pulse 1663 is received. In this case the sampling time is too short. The conversion request signal REQy will not be asserted or activated.

A similar situation occurs with the fourth sampling trigger pulse 1664. The falling edge occurs before the minimum sampling time has elapsed. Thus the sampling time is too short, or in other words, the sampling trigger pulse is too short. As a consequence, no conversion request signal is generated with respect to rigger pulse 1664.

Figure 17:
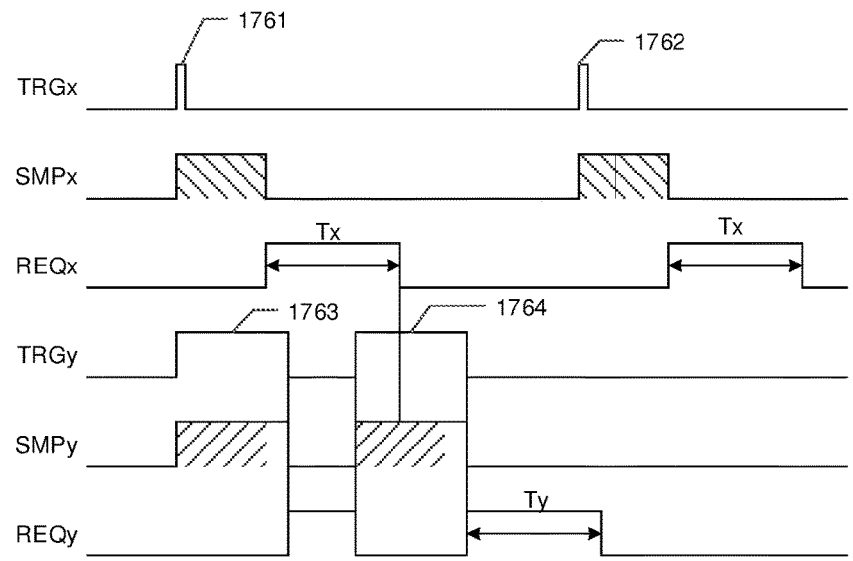
FIG. 17 shows a timing diagram illustrating a conversion request without Analog-to-Digital conversion.

FIG. 17 shows a timing diagram of a further embodiment. In this example two channels or respective requesting units provide sampling trigger signals (TRGx and TRGy). The first channel x deploys the rising edge of sampling trigger pulse 1761 to start sampling and subsequently provide the corresponding conversion request signal REQx as soon as the corresponding sampling process has been completed (indicated by the falling edge of SMPx).

In contrast to the first channel x, the second channel y implements a mechanism where the falling edge of the sampling trigger signal TRGy defines the end of the sampling window. The sampling process for channel y starts immediately (indicated by the rising edge of SMPy). The conversion request signal REQy is being activated with the falling edge of pulse 1763.

Because the conversion of channel x is still ongoing during time Tx, the conversion of channel y is not possible although the request signal REQy has been activated. During the conversion of channel x, a second sampling trigger pulse 1764 is received and the sampling process is directly started. If this sampling trigger pulse 1764 is deactivated, or in other words, the corresponding falling edge of pulse 1764 is received, the conversion of channel y is started.

It can be seen in FIG. 17 that the pulse length of pulse 1764 is longer than the shaded area of SMPy, i.e. that the sampling time criteria is fulfilled in this case. The input that corresponds to channel y is then converted during a time window indicated by Ty. Like this, always the latest correctly sampled value may be converted.

FIG. 18 shows a process flow 1800 of a method of generating a conversion request signal in accordance with various embodiments.

In various embodiments, the method includes receiving sampling trigger information to trigger sampling performed by a sample and hold stage which is configured to generate a sampled output (in 1801) and receiving status information to determine whether a corresponding Analog-to-Digital-Converter is ready for converting the sampled output (in 1802). Only in cases when the status information indicates that the corresponding Analog-to-Digital-Converter is ready for converting the sampled output, the method further comprises the sampling of an analog input by the sample and hold stage during a sampling time (in 1804). Only if this sampling process fulfills predefined sampling criteria, the conversion into a numeric value, performed by an Analog-to-Digital-Converter, will be requested (in 1806).

The readiness for conversion may be indicated by a collision detection signal. In various embodiments, the sampling is only started if a corresponding ADC is available, i.e. that an associated conversion would be possible after sampling. This also indicates that the ADC is not busy with converting a previous sample and a new sampling phase may be started.

In various embodiments, the sampling criteria define whether sampled data are valid data or nor. For example, if the sampling time is shorter than a give or predetermined threshold, the sampled data is not valid. As a consequence, there is no subsequent conversion.

In various embodiments, the sampling criteria are based on a certain timeframe for sampling.

The predetermined or predefined sampling criteria may include a combination of a minimum sampling time and a valid time window or timeframe for performing the sampling or any other criteria that can be used to declare the sampled input value as valid.

In various embodiments, the disclosed method provides only a conversion request if the sampling process is successful. If for any reason the sampling process is not successful, an analog-to-digital conversion would not be requested.

In various embodiments the method provides a separation between the sample and hold timing domain and the ADC conversion timing domain.

In various embodiments, the method allows control of the precise sampling while the process of the ADC conversion is timewise separated.

In various embodiments, the fulfillment of sampling criteria is indicated by an external signal. E.g., if a dedicated signal indicates invalid sampled data, sampling criteria are considered to be not fulfilled.

In case the Analog-to-Digital (ADC) converter serves multiple channels, a busy ADC or an ADC which is not ready for conversion, is characterized by a blocking behavior as far as the same channel is concerned. So if, for example, the conversion of channel x is requested and the ADC is currently converting channel y, the ADC is not assumed to be busy, or is ready for conversion respectively.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol.

In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

The techniques of this disclosure may be implemented in a wide variety of devices or apparatuses, including an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of intraoperative hardware units, including one or more processors as described above, in conjunction with suitable software and/or firmware.

The invention claimed is:

1. A method, comprising:
receiving sampling trigger information to trigger sampling performed by a sample and hold stage which is configured to generate a sampled output;
receiving status information to determine whether a corresponding Analog-to-Digital-Converter is ready to convert the sampled output;
if the status information indicates that the corresponding Analog-to-Digital-Converter is ready to convert the sampled output, sampling an analog input by the sample and hold stage during a sampling time; and
if the sampling fulfills predefined sampling criteria, requesting conversion to be performed by the Analog-to-Digital-Converter.

2. The method of claim 1, wherein the predefined sampling criteria comprise a minimum sampling time.

3. The method of claim 1, wherein the predefined sampling criteria comprise that the sampling occurred in a valid time window.

4. The method of claim 1, wherein the sampling trigger information is generated by a requester.

5. The method of claim 1, further comprising providing a timestamp indicating the sampling time.

6. A device, comprising:
a first sample and hold circuit configured to provide a first sampled output to be converted by an Analog-to-Digital-Converter comprising:
a first sampling control circuit configured to receive a first trigger information to trigger sampling of a first analog input, and to receive a first collision detection information from the Analog-to-Digital-Converter to detect a collision, and
a first sample and hold stage coupled to the first sampling control circuit and configured to sample the first analog input, only if no collision has been detected by the first sampling control circuit,
wherein the first sampling control circuit is further configured to check predefined first sampling criteria and to output a first conversion request to the Analog-to-Digital-Converter, only if the predefined first sampling criteria are fulfilled.

7. The device of claim 6, wherein the predefined first sampling criteria comprise a minimum sampling time.

8. The device of claim 6, wherein the predefined first sampling criteria comprise that the sampling occurred in a valid time window.

9. The device of claim 6, wherein the first sample control circuit is further configured to provide a first timestamp indicating a time of sampling.

10. The device of claim 9, wherein the predefined first sampling criteria comprise an outdated first timestamp.

11. The device of claim 6, further comprising:
an Analog-to-Digital-Converter configured to receive the first sampled output and to convert the first sampled output into an output value if a conversion is requested.

12. The device of claim 11, wherein the Analog-to-Digital-Converter comprises:
an Analog-to-Digital-Conversion control circuit configured to receive the first conversion request, to provide the first collision detection information to indicate whether a collision is detected, and to provide a selected sampled output; and
an Analog-to-Digital-Conversion circuit configured to convert the selected sampled output into a digital value.

13. An Analog-to-Digital-Conversion (ADC) system, comprising:
a device according to claim 11, further comprising:
a second sample and hold circuit configured to provide a second sampled output to be converted by the Analog-to-Digital-Converter comprising:

a second sampling control circuit configured to receive a second trigger information to trigger sampling of a second analog input, and to receive a second collision detection information from the corresponding Analog-to-Digital-Converter to detect a collision; and a second sample and hold stage coupled to the second sampling control circuit and configured to sample the second analog input, only if no collision has been detected by the second sampling control circuit, wherein the second sampling control circuit is further configured to check predefined second sampling criteria, and to output a second conversion request to the Analog-to-Digital-Converter, only if the predefined second sampling criteria are fulfilled.

14. The ADC conversion system of claim 13, wherein the Analog-to-Digital-Converter comprises:

an Analog-to-Digital-Conversion control circuit configured to receive the second conversion request, to provide the second collision detection information, and to select one of the first and second conversion requests according to a predefined arbitration scheme.

15. The ADC conversion system of claim 14, wherein the Analog-to-Digital-Conversion control circuit is further configured to receive a status message from the Analog-to-Digital-Conversion circuit, wherein the status message comprises information about an operating mode of the Analog-to-Digital-Conversion circuit, and wherein the Analog-to-Digital-Conversion control circuit is further configured to activate a starting signal to start conversion of a sampled output signal if the Analog-to-Digital-Conversion circuit is not in conversion mode.

16. The ADC conversion system of claim 14, further comprising:

a multiplexer configured to select one of the plurality of sampled output signals to be controlled by the Analog-to-Digital-Conversion control circuit.

17. The ADC conversion system of claim 13, wherein the first sample control circuit is further configured to provide a first timestamp, wherein the second sample control circuit is further configured to provide a second timestamp, and wherein Analog-to-Digital-Conversion control circuit is further configured to receive the first and second timestamp for further processing.

18. The ADC conversion system of claim 17, wherein the first timestamp denotes the end of a first sampling interval, and the second timestamp denotes the end of a second sampling interval.

19. The ADC conversion system of claim 17 further comprising:

a memory configured to store the first or second timestamp in addition to the digital output signal.

20. The ADC conversion system of claim 17, wherein the Analog-to-Digital-Conversion control circuit is configured to measure a current time value, to generate a time difference value based on the current time value and the first or second timestamp, and to store the digital output signal if the time difference value is smaller than a predefined threshold.

\* \* \* \* \*